(12) United States Patent
Aggeler et al.

(10) Patent No.: US 8,912,840 B2
(45) Date of Patent: Dec. 16, 2014

(54) SWITCHING DEVICE WITH A JFET SERIES ARRANGEMENT

(75) Inventors: Daniel Aggeler, Zurich (CH); Jürgen Biela, Zurich (CH); Johann Walter Kolar, Zurich (CH)

(73) Assignee: Eth Zurich, Eth Transfer, Zurich (CH)

( * ) Notice: Subject to any disclaimer, the term of this patent is extended or adjusted under 35 U.S.C. 154(b) by 158 days.

(21) Appl. No.: 13/638,063

(22) PCT Filed: Apr. 6, 2011

(86) PCT No.: PCT/CH2011/000072
§ 371 (c)(1),
(2), (4) Date: Oct. 30, 2012

(87) PCT Pub. No.: WO2011/123962
PCT Pub. Date: Oct. 13, 2011

(65) Prior Publication Data
US 2013/0057332 A1   Mar. 7, 2013

(30) Foreign Application Priority Data

Apr. 7, 2010  (CH) ...................................... 0500/10

(51) Int. Cl.
*H03K 17/687* (2006.01)
*H03K 17/10* (2006.01)
*H03K 17/567* (2006.01)

(52) U.S. Cl.
CPC ............ *H03K 17/102* (2013.01); *H03K 17/107* (2013.01); *H03K 17/567* (2013.01); *H03K 2017/6875* (2013.01)

USPC ......................................................... 327/430

(58) Field of Classification Search
USPC .................. 327/392–394, 398, 399, 427, 430
See application file for complete search history.

(56) References Cited

U.S. PATENT DOCUMENTS 7,148,736 B1 * 12/2006  Tihanyi et al. ................. 327/377
8,723,589 B2 *  5/2014  Biela et al. ..................... 327/430
8,760,214 B2 *  6/2014  Biela et al. ..................... 327/430

FOREIGN PATENT DOCUMENTS

WO         2010-088783         8/2010

OTHER PUBLICATIONS

Biela J et al; Balancing circuit for a 5kV/50ns Pulsed Power Switch Based on SiC-JFET Super Cascode, 2009.

* cited by examiner

*Primary Examiner* — Hai L Nguyen
(74) *Attorney, Agent, or Firm* — Rankin, Hill & Clark LLP

(57) ABSTRACT

A switching device for switching a current between a first connection and a second connection including a series circuit of at least two JFETs (J1-Jn), with further JFETs (J2-Jn), which are connected in series to a lowest JFET (J1), and wherein a wiring network for stabilizing the gate voltages of the JFETs (J1-Jn) is connected between the second connection and the first termination. One additional circuit is connected between each gate connection (GJ2, GJ3 ... GjN) of the further JFETs (J2-Jn) and associated cathode connections of diodes (DAV) of the wiring network. During switch-on and in the switched-on state, said additional circuit keeps the potential of the respective gate connection higher than the potential of the associated source connection.

7 Claims, 3 Drawing Sheets

SWITCHING DEVICE WITH A JFET SERIES ARRANGEMENT

BACKGROUND OF THE INVENTION

1. Field of the Invention

The invention relates to the field of electronic switch technology and in particular to a switching device with a series arrangement of JFETs (junction field effect transistors).

2. Description of Related Art

Power switches or switching devices for switching at high operating voltages can be realised in power-electronic circuits by way of cascading or serially arranged transistors. Thereby, according to U.S. Pat. No. 6,822,842 or DE 199 26 109 A1, such switching devices are, for example, indicated as a cascode circuit, and are based on the special arrangement of a MOSFET M and at least one JFET $J_1$, illustrated by FIG. 1. The switches are arranged between a first terminal 1 and a second terminal 2 and are controlled by a control connection 3 of the MOSFET M. This known switching device for high operating voltages based on the cascode topology envisages the connection of several JFETs $J_2 \ldots J_n$ in series, and thus the attainment of a high blocking voltage. A circuit network 4 is connected between the first terminal 1 and the second terminal 2, for the passive control of the dynamic blocking voltage distribution of the power switch constructed with the transistors arranged in series, wherein avalanche diodes $D_{Av,1}$-$D_{AV,n}$ of the circuit network 4 are connected between the gate terminals of the JFETs. The manner of functioning of the circuit network 4 for the symmetrical blocking voltage distribution of the JFETs is described in the publication "Balancing Circuit for a 5 kV/50 ns Pulsed Power Switch Based on SiC-JFET Super Cascode" (J. Biela, D. Aggeler, J. W. Kolar, Proceedings of the $17^{th}$ IEEE Pulsed Power Conference (PPCV'09)).

In the switched-on condition, a voltage drop across each element arises due to the forward resistances of the individual semiconductor switches M, $J_1 \ldots J_n$ in the series arrangement. Thereby, the sum of all voltage drops particularly with the uppermost JFET $J_n$ of FIG. 1 causes a different gate-source voltage than at the lower JFETs. This different gate-source voltage can lead to the uppermost transistor switching off and thereby becoming high-impedance and experiencing a high forward voltage in the switched-on state, which leads to its destruction in the worst case.

BRIEF SUMMARY OF THE INVENTION

It is therefore the object of the invention, to provide a switching device with a series arrangement of JFETs of the initially mentioned type, which overcomes the mentioned disadvantages.

The switching device for switching a current between a first terminal and a second terminal thus comprises a series arrangement of at least two JFETs, of which a lowermost JFET is connected to the first terminal or is connected to the first terminal via a control switch arranged in series. At least one further JFET is present, which is connected in series to the lowermost JFET, wherein the JFET which is distanced furthest to the lowermost JFET is indicated as the uppermost JFET and with its drain terminal is connected to the second terminal. The JFETS which are different from the lowermost or first JFET are commonly also indicated as upper JEFTs. A circuit network for the dynamic blocking voltage distribution and for the stabilisation of the gate voltages of the JFETs is connected between the first terminal and the second terminal. The circuit network, for example, in each case comprises diodes operated in the blocking direction, between the gates of two consecutive JFETs. Thereby, an additional circuit is connected in each case between the gate terminals of the upper JFETs and the cathode of the respective diode, and this additional circuit in the switched-on state of the circuit maintains a high potential at the gate terminal of the upper JFETs, and prevents an undesired switching-off of the upper JFET.

By way of this, with switched-on upper JFETs, the voltages at the upper gates are kept slightly above, preferably however equal to or slightly below the voltage at the respective source terminal, depending on the load current. Preferably, a gate-source voltage results, which is at least two times, preferably five times or ten times smaller than without the additional circuit. When switching-on, the upper JFETS tend to remain switched on more so than without the additional circuit, on account of this. By way of this, one again prevents, in particular, the uppermost JFET between the first and the second terminal becoming high-impedance and taking up the complete voltage.

The additional circuit has the effect that when switching on, the parasitic capacitances of the circuit network can be discharged in each case via the diode of the additional circuit and simultaneously the voltages of the respective gates of the JFETs being kept high via a capacitance parallel to the diode of the additional circuit.

By way of this, the dynamic switching-on of the power switch which is constructed with transistors arranged in series, is balanced as well as synchronised due to the complete additional circuit network.

The additional circuit seen per se, generally speaking and for each of the JFETs is capable of applying a settable voltage between its gate terminal and source terminal. This additional circuit effects a symmetrical voltage loading of the gate-source terminals of the JFETs connected in series.

In further preferred embodiments of the invention, the additional circuit is not connected at each of the upper JFETs, but only at one or more, preferably at JFETs lying further to the top.

In a further embodiment of the invention, a further diode is connected antiparallel to the existing diode and in series with the capacitor of the additional circuit, in at least one of the additional circuits. This resulting activation circuit has the effect that the capacitors of the additional circuit do not discharge during the dynamic switching-on and the static switched-on condition and thus the gate potentials of the upper JFETs remain at defined potential.

In a further embodiment of the invention, the sequence of the diode and the additional circuit in the series arrangement is the other way round: the additional circuit is not connected between the gate terminal and the cathode terminal, but between the gate terminal of the respective lower JFET and the anode terminal of the respective diode.

Basically, it is the case that the circuit in this context can be applied in a modified manner also for p-channel JFETs instead of the n-channel JFETs which are indicated here. Thereby, complementarily, the drain terminal corresponds to the source terminal and the source terminal to the drain terminal.

Further preferred embodiments are to be deduced from the dependent patent claims.

BRIEF DESCRIPTION OF THE DRAWINGS

The subject-matter of the invention is hereinafter explained in more detail by way of preferred embodiment examples which are represented in the accompanying drawings. In each case are schematically shown in.

Basically, the same parts are provided with the same reference numerals in the figures.

DETAILED DESCRIPTION OF THE INVENTION

Figure 1:
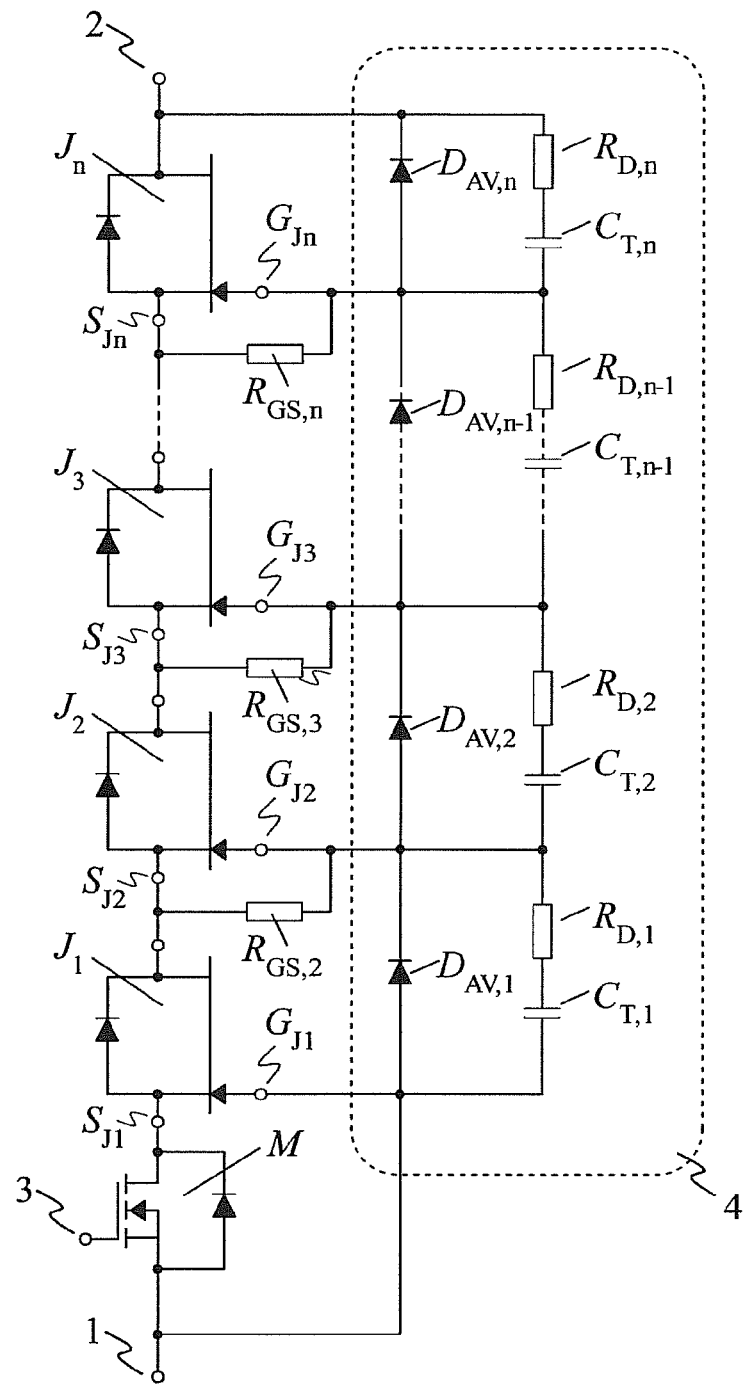
FIG. 1 a series arrangement of JFETs according to the state of the art.

The invention for a switching device of a high operating voltage is represented in FIG. 1. The switch comprises a cascode arrangement of a MOSFET M with a first or lowermost JFET $J_1$ and at least one further or upper JFET $J_2$-$J_n$ which is connected in series to this first JFET $J_1$. The lowermost or first JFET is therefore activated in the cascode circuit by a MOSFET acting as a control switch. The last JFET of the JFETs connected in series and which is distanced furthest from the first JFET is also indicated as the uppermost JFET $J_n$. A circuit network 4 is arranged for stabilising the gate voltages of the JFETs and for smoothing out the voltage load of the JFETs. This circuit network, in each case, between the gates of two consecutive JFETs comprises a parallel arrangement of diodes $D_{AV,1}$, $D_{AV,2}$, ... $D_{AV,n}$ which are operated in the blocking direction, and an RC-circuit $R_{D,1}$, $C_{T,1}$, $R_{D,1}$, $C_{T,2}$, ... $R_{D,n}$, $C_{T,n}$.

In each case, resistors (in FIG. 1: $R_{GS,2}$-$R_{GS,n}$) are connected between the gate and the source of the upper JFETs $J_2$-$J_n$, (thus not of the first JFET). One can also use Zener diodes instead of resistors.

Figure 2:
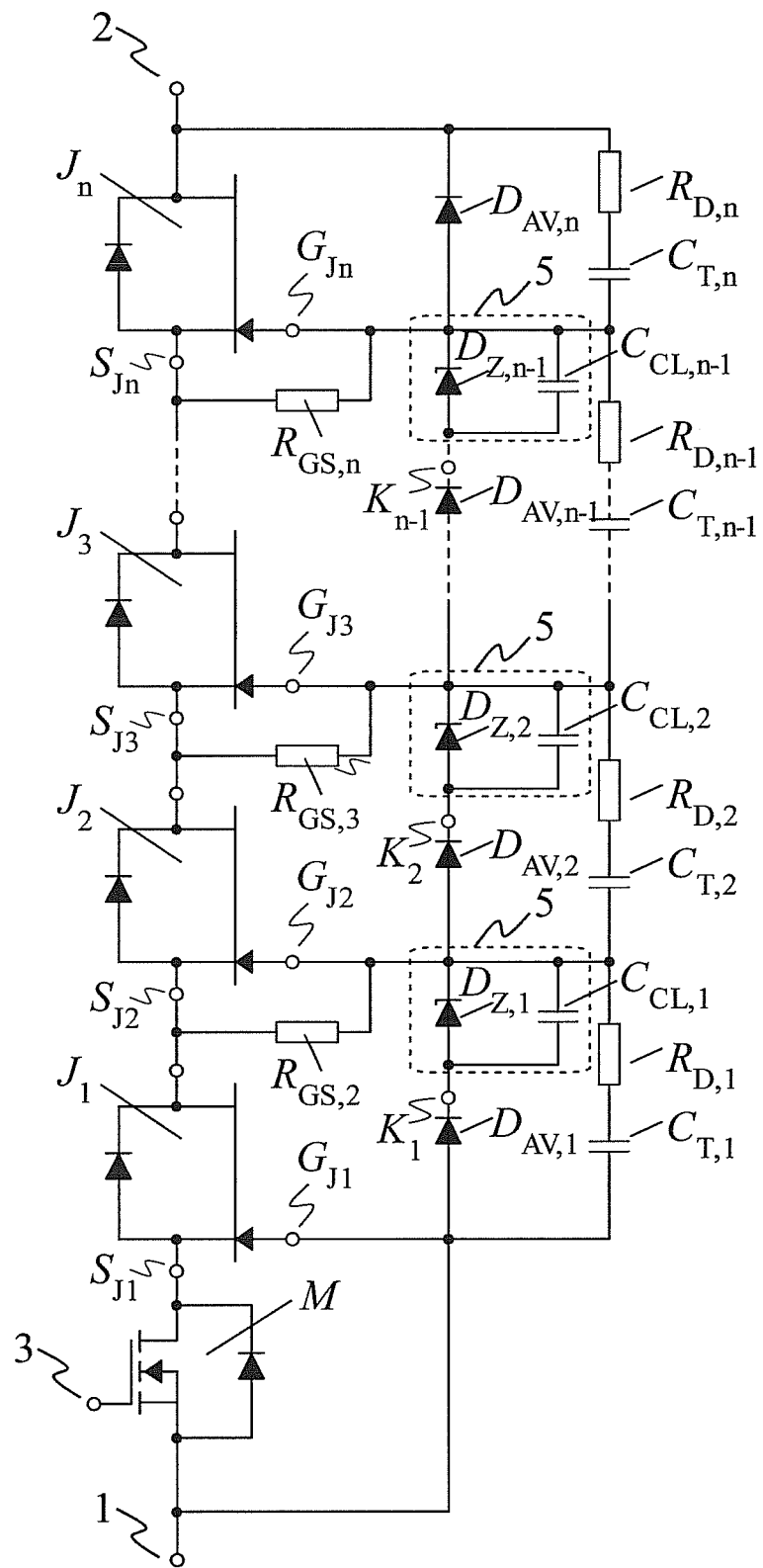
FIG. 2 a first embodiment of the invention.

An additional circuit 5 is connected in each case between the gate ($G_{J2}$, $G_{J3}$ ... $G_{Jn}$) and the cathode terminal ($K_1$, $K_2$, ... $K_{n-1}$) of the diode of the circuit network, for the dynamic and also static control of the gate voltages. Each additional circuit 5 according to FIG. 2 comprises a parallel arrangement of a Zener diode $D_{Z,1}$, $D_{Z,2}$ ... $D_{Z,n-1}$ and of a capacitor $C_{CL,1}$, $C_{CL,2}$ ... $C_{CL,n-1}$. The effect of these is that the potential at the gate terminal of the upper JFETS is kept high and thus on the one hand the forwards voltage of the diodes, and on the other hand the voltage drop resulting due to the forward resistance are compensated, and the voltage prevailing between the gate terminal and the source terminal is preferably equal to zero or kept slightly positive.

The capacitance or capacitor of the additional circuit, compared to the junction capacitance of the diodes operated in the blocking direction and to the drain-source capacitance of the respective JFETs, is a multiple greater and due to this, when switching on, has the effect that the stored energy cannot be completely withdrawn and a resulting voltage across the capacitor of the additional circuit remains and this keeps the voltage of the respective gate high.

The circuit network leads a charging current from the gate terminals of the JFETs ($J_1$-$J_n$) into the respectively assigned storage element (junction capacitance of the diode operated in the blocking direction and capacitance of the RC-element of the circuit network with the additional circuit) and thus effects a dynamic stabilisation of the JFETs connected in series.

Other switch elements which have the same effect, e.g. only one or two or more Zener diodes connected in series, or only one or two or more capacitors connected in parallel, can be present in the additional circuit instead of the Zener diode and the capacitor.

In a preferred embodiment of the invention, the additional circuit is not connected at each of the upper JFETs, but only at one or more, preferably at JFETs lying further up.

Figure 3:
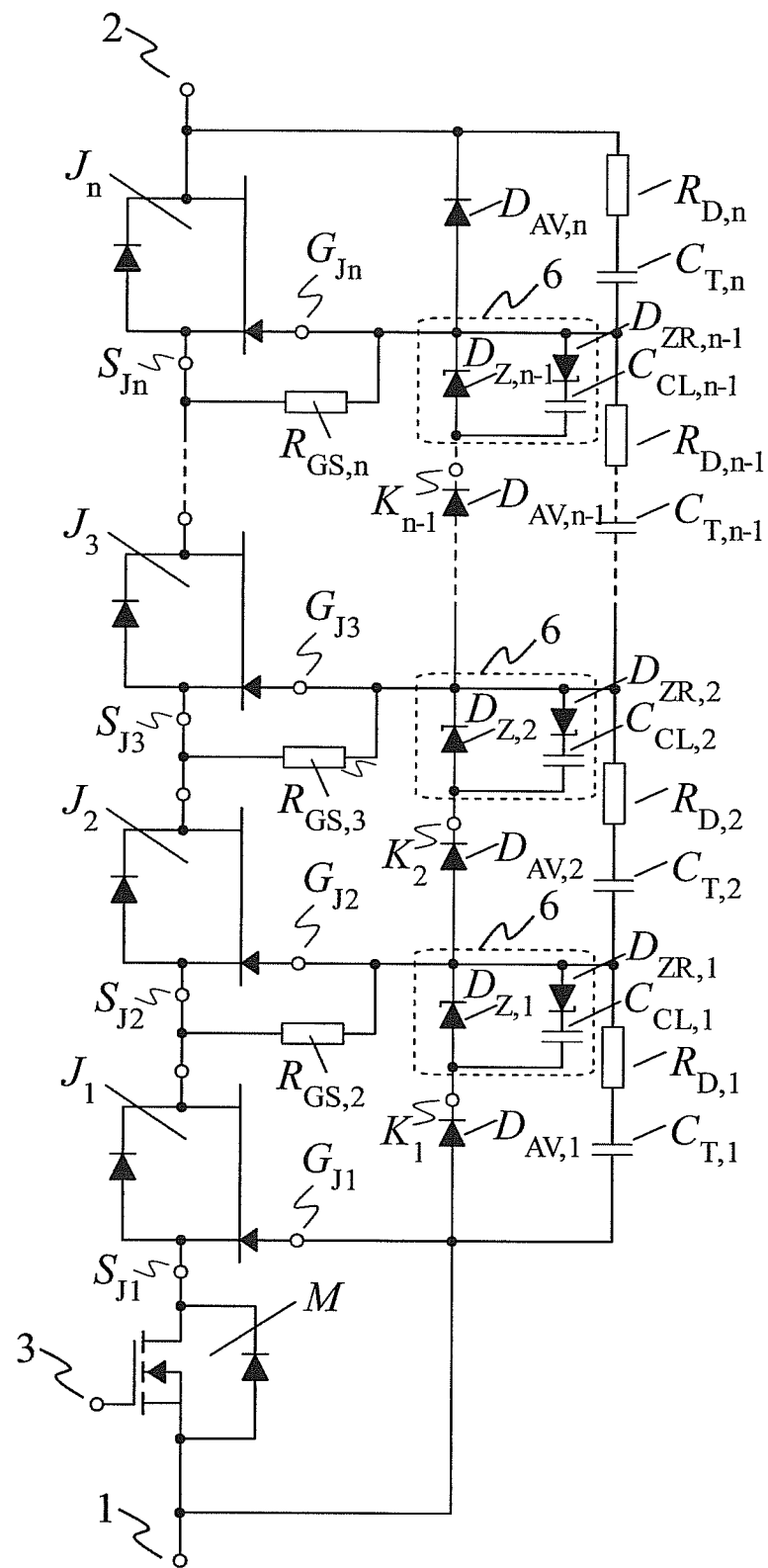
FIG. 3 a second embodiment of the invention.

FIG. 3 shows an alternative preferred embodiment of the invention, in which further diodes $D_{ZR,1}$, $D_{ZR,2}$ ... $D_{ZR,n-1}$ are each connected in series to the capacitor and antiparallel to the diode of the additional circuit.

It is basically the case for the invention as a whole, that the circuit can also be applied in a modified manner for p-channel JFETs instead of the n-channel JFETs indicated here.

The invention claimed is:

1. A switching device for switching a current between a first terminal and a second terminal, comprising:

a series arrangement of at least two JFETs of which a lowermost JFET is connected to a first terminal or the lowermost JFET is connected in a cascade arrangement via a control switch to the first terminal, and of one or more further, upper JFETs which is or are connected in series to the lowermost JFET, wherein the JFET which is distanced furthest from the lowermost JFET is indicated as the uppermost JFET and with its drain terminal is connected to a second terminal, wherein a passive circuit network for the dynamic activation of the gate voltages of the JFETs is connected between the gate terminals of the JFETs and the first terminal, wherein the passive circuit network in each case between the gates of two consecutive JFETs comprises diodes which are operated in the blocking direction, wherein an additional circuit is connected in each case between the gate terminals of the upper JFETs and the cathode terminals of the diodes of the circuit network, or between anode terminals of the diodes of the circuit network and the gate terminals of assigned JFETs, and this additional circuit keeps the potential of the respective gate terminal high with respect to the associated source terminal, during the dynamic switching-on as well as in the stationary switched-on state;

wherein the additional circuit comprises one or more diodes which are operated in series and in the blocking direction between the gate terminals and the cathode terminals; and, wherein the additional circuit comprises one or more capacitors which are in each case parallel to the diodes operated in the blocking direction.

2. The switching device according to claim 1, wherein the additional circuit comprises one or more diodes which are operated in series and in the blocking direction between the gate terminals and the cathode terminals.

3. The switching device according to claim 1, wherein the additional circuit comprises one or more capacitors which are in each case parallel to the diodes operated in the blocking direction.

4. The switching device according to claim 1, wherein the additional circuit and the activation circuit are designed such that with a switching-on procedure and with the switched-on state, the voltage drops occurring at the upper JFETs as well as the forward voltage of the diodes of the circuit network which are operated in the blocking direction, are reduced, and wherein in comparison to the switching device without an additional circuit or activation circuit, a gate-source voltage results which is at least two times smaller, or no voltage drop results or the gate-source voltage is slightly positive.

5. The switching device according to claim 1, wherein at least one activation circuit comprising an additional circuit and of a further diode is present.

6. The switching device according to claim 5, in which in at least one of the additional circuits, a further diode is connected in series to the capacitor of the additional circuit and antiparallel to the diode of the additional circuit.

7. A switching device for switching a current between a first terminal and a second terminal, comprising:

a series arrangement of at least two p-channel JFETs, of which a lowermost JFET is connected to a first terminal, or the lowermost JFET is connected in a cascade arrangement via a control switch to the first terminal, and of one or more further, upper JFETs which is or are connected in series to the lowermost JFET, wherein the JFET which is distanced furthest from the lowermost JFET is indicated as the uppermost JFET and with its source terminal is connected to a second terminal, wherein a passive circuit network for the dynamic activation of the gate voltages of the JFETs is connected between the gate terminals of the JFETs and the first terminal, wherein the passive circuit network in each case between the gates of two consecutive JFETs comprises diodes which are operated in the blocking direction, wherein an additional circuit is connected in each case between the gate terminals of the upper JFETs and the cathode terminals of the diodes of the circuit network, or between anode terminals of the diodes of the circuit network and the gate terminals of assigned JFETs, and this additional circuit keeps the potential of the respective gate terminal high with respect to the associated drain terminal, during the dynamic switching-on as well as in the stationary switched-on state;

wherein the additional circuit comprises one or more diodes which are operated in series and in the blocking direction between the gate terminals and the cathode terminals; and, wherein the additional circuit comprises one or more capacitors which are in each case parallel to the diodes operated in the blocking direction.

\* \* \* \* \*